US007724504B2

(12) United States Patent
Lee

(10) Patent No.: US 7,724,504 B2
(45) Date of Patent: May 25, 2010

(54) SATELLITE RECEIVER

(75) Inventor: Chia-Wei Lee, Taipei Hsien (TW)

(73) Assignee: Wistron NeWeb Corporation, Hsi-Chih, Taipei Hsien (TW)

( * ) Notice: Subject to any disclaimer, the term of this patent is extended or adjusted under 35 U.S.C. 154(b) by 1211 days.

(21) Appl. No.: 11/164,657

(22) Filed: Nov. 30, 2005

(65) Prior Publication Data

US 2007/0087685 A1 Apr. 19, 2007

(30) Foreign Application Priority Data

Oct. 17, 2005 (TW) .............................. 94136161 A

(51) Int. Cl.
*H05K 5/00* (2006.01)
*H05K 7/00* (2006.01)

(52) U.S. Cl. .............................. 361/679.01; 312/223.1; 312/334.46

(58) Field of Classification Search ............ 361/679.01; 312/223.2, 223.6, 334.46, 223.1; 455/3.02
See application file for complete search history.

(56) References Cited

U.S. PATENT DOCUMENTS 5,625,533 A * 4/1997 Kim et al. .............. 361/679.21
2005/0243522 A1 * 11/2005 Nilsen et al. ................ 361/716

* cited by examiner

*Primary Examiner*—Jayprakash N Gandhi
*Assistant Examiner*—Anthony M Haughton
(74) *Attorney, Agent, or Firm*—Winston Hsu

(57) ABSTRACT

There are a first stopper and a second stopper positioned on a main body of a satellite receiver. A cover having a block is coupled with the main body of the satellite receiver. The block of the cover is capable of sliding between the first stopper and the second stopper when the cover is coupled with the main body.

10 Claims, 8 Drawing Sheets

SATELLITE RECEIVER

BACKGROUND OF THE INVENTION

1. Field of the Invention

The present invention relates to a satellite receiver, and more particularly, to a satellite receiver having a cover.

2. Description of the Prior Art

Since typical satellite receivers are positioned outside, a cover is usually coupled with a satellite receiver to protect signal transmission connectors of the satellite receiver from rain. Generally, the cover is a plastic cover. However, the main body of a satellite receiver is typically made of aluminum alloy, and thereby includes a plastic main body to receive the connector of the cover. The prior art relies on plastic-to-plastic connector of the cover to the satellite receiver, and therefore has increased cost.

SUMMARY OF THE INVENTION

The claimed invention provides a satellite receiver. The satellite receiver comprises a main body and a cover. There are a first stopper and a second stopper positioned on the main body. The cover comprises a block disposed on an inner side of the cover. The block is capable of sliding between the first stopper and the second stopper when the cover is coupled with the main body.

These and other objectives of the present invention will no doubt become obvious to those of ordinary skill in the art after reading the following detailed description of the preferred embodiment that is illustrated in the various figures and drawings.

DETAILED DESCRIPTION

In order to reduce cost and protect signal transmission connectors of the satellite receiver from rain, the present invention provides a method of connecting a cover and a satellite receiver, even though the materials of the cover and the satellite receiver are different.

Figure 1:
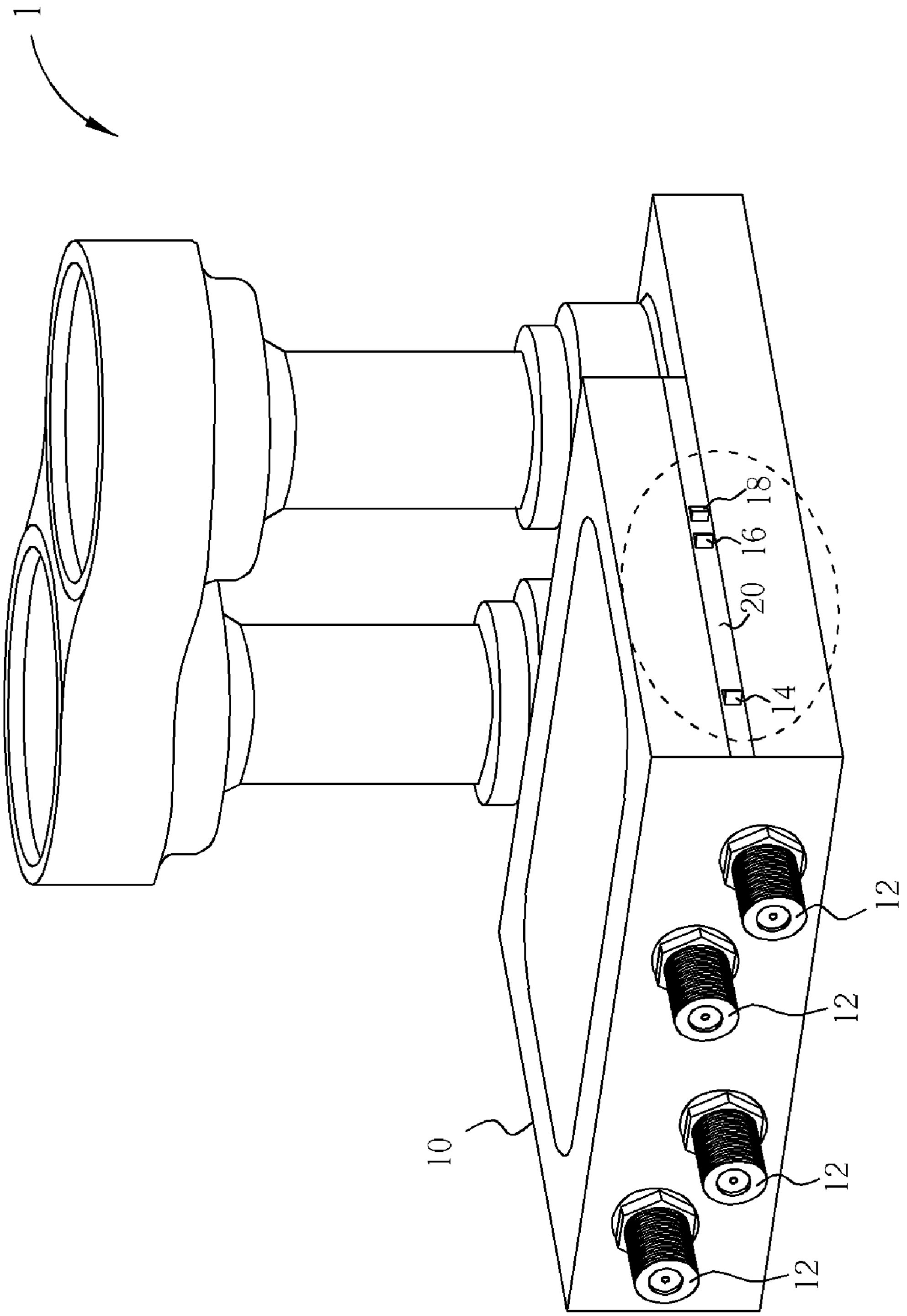
FIG. 1 is an illustration of a satellite receiver based on the present invention.
Figure 2:
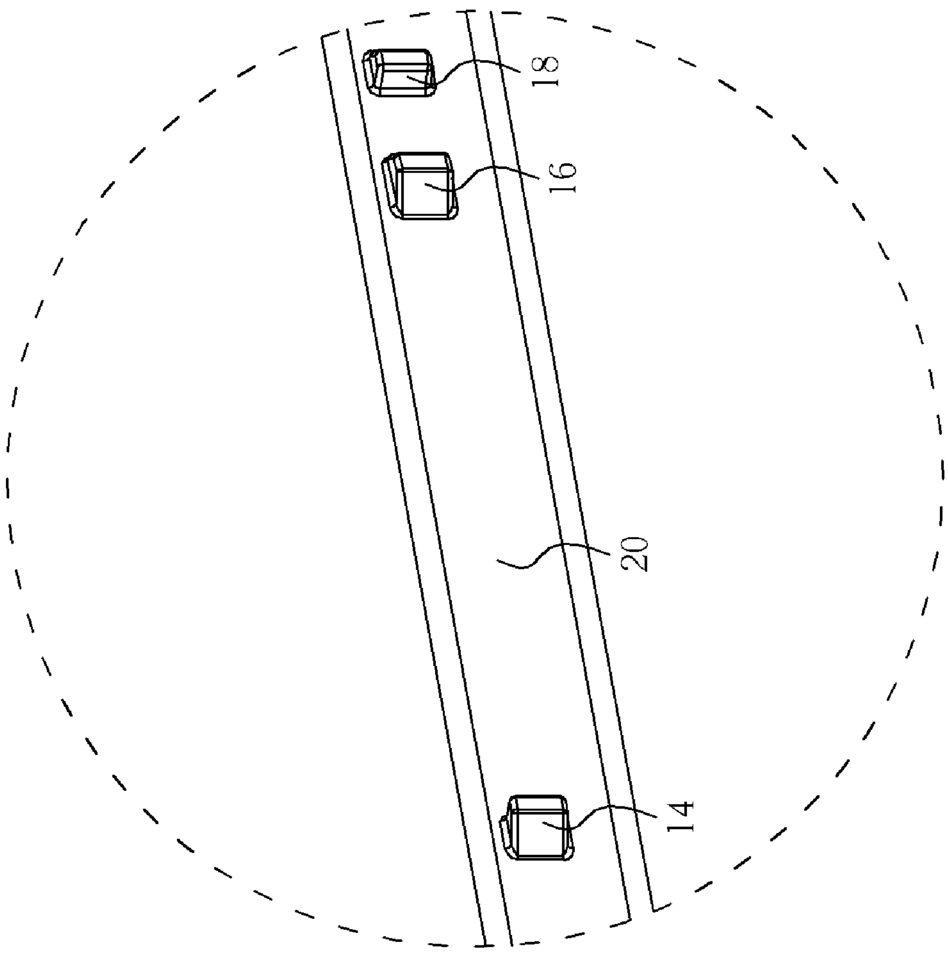
FIG. 2 is an enlargement of the three stoppers of FIG. 1.

Please refer to FIG. 1, which is an illustration of a satellite receiver 1 based on the present invention. The satellite receiver 1 comprises a main body 10 and a plurality of signal transmission connectors 12 positioned at a side of the main body 10. There are a first stopper 14, a second stopper 16, and a third stopper 18 positioned on the main body 10. The enlargement of the three stoppers 14, 16, 18 is shown in FIG. 2. The main body 10 further comprises a track 20 on which the three stoppers 14, 16, 18 are positioned.

Figure 3:
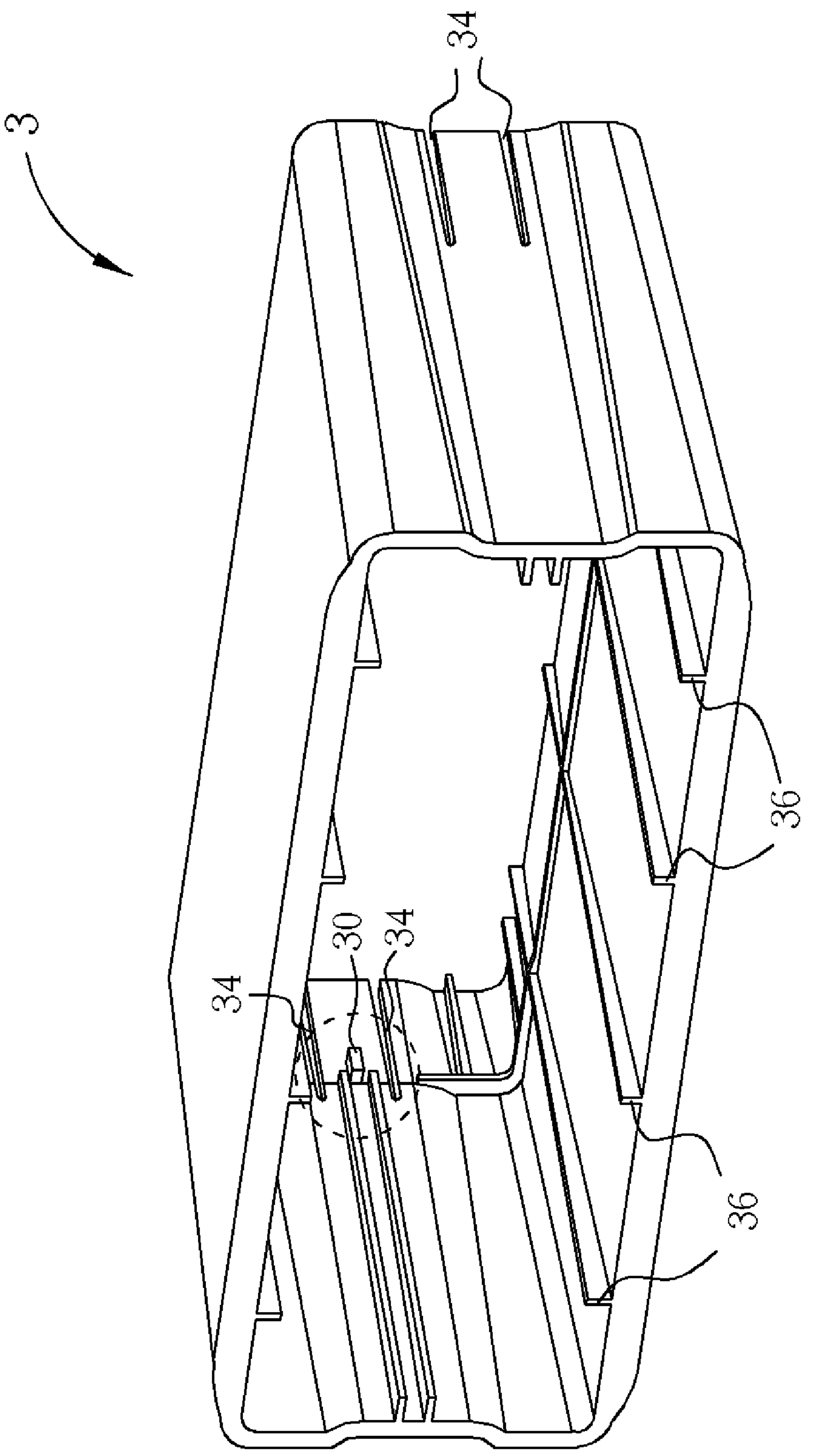
FIG. 3 is an illustration of a cover based on the present invention.
Figure 4:
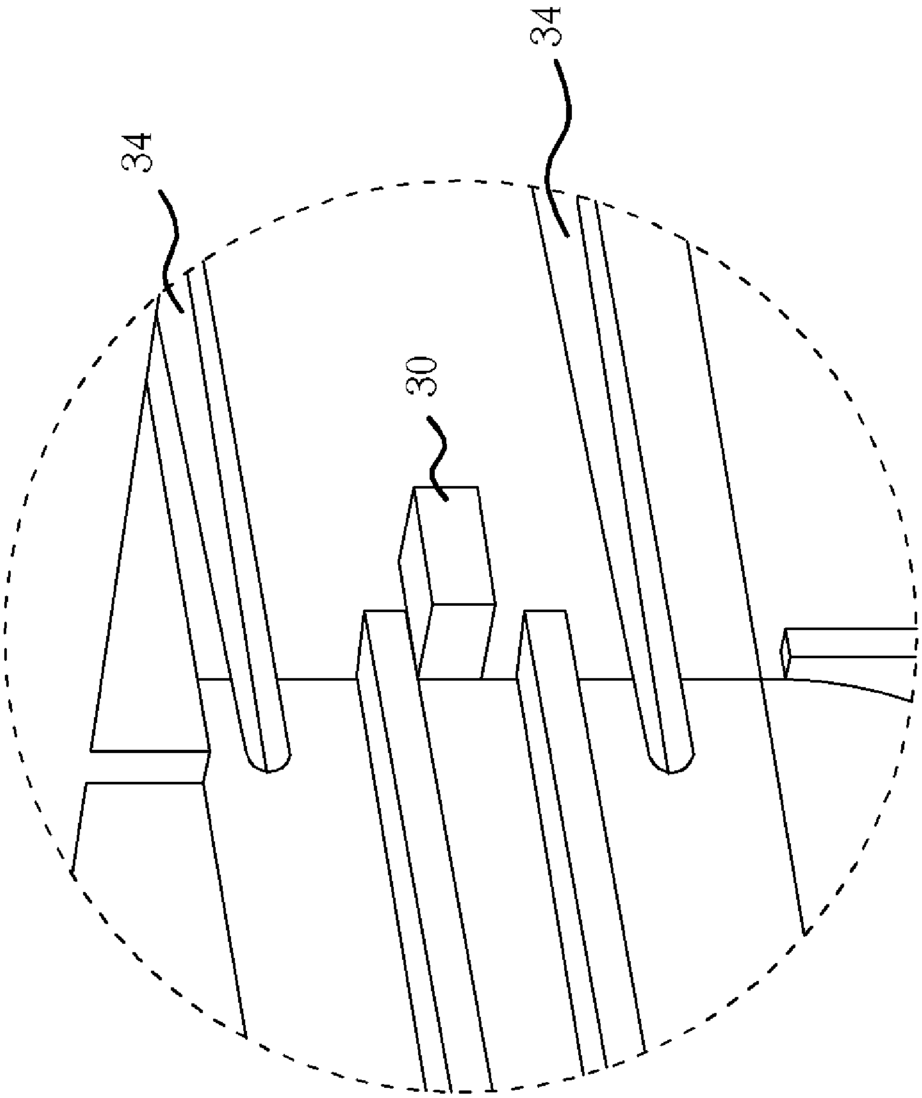
FIG. 4 is an enlargement of a portion of FIG. 3.

Please refer to FIG. 3, which is an illustration of a cover 3 of the present invention. There are blocks 30 disposed on both inner sides of the cover 3. The block 30 engages the first stopper 14, the second stopper 16, or the third stopper 18 to locate the cover 3 on the main body 10. There is a slot 34 formed on the cover, as shown in FIG. 4. FIG. 4 is an enlargement of dashed-line encircled part of FIG. 3. The block 30 of the cover 3 is positioned at an end of the slot 34. The slot 34 is capable of assisting the block 30 in crossing the first stopper 14 or the second stopper 16 of the main body 10. FIGS. 3 and 4 only show the block 30 and the slot 34 on the left inner side. There is also a block 30 and a slot 34 on the right inner side of the cover 3. Additionally, there is a plurality of tapered ribs 36 on the inner sides of the cover 3. When the cover 3 is coupled with the main body 10, the ribs 36 assist the cover 3 in contacting the main body 10 closely. In addition, during injection press molding, it is convenient to pull out the mold using the ribs 36.

Since the main body 10 of the satellite receiver 1 is made of aluminum alloy and the cover is made of plastic, the present invention adds the first stopper 14, the second stopper 16, and the third stopper 18 on the main body 10 to engage the block 30 of the cover 3 so as to locate the cover 3 on the main body 10. Thus, the present invention accomplishes the purpose of connecting elements of different materials. The distance between the first stopper 14 and the second stopper 16 is an allowable distance for the cover 3, the allowable distance being termed "stroke." When establishing the stroke, the sizes of the signal transmission connectors 12 should be considered to make the cover 3 cover all signal transmission connectors 12 and protect them from rain.

Figure 5:
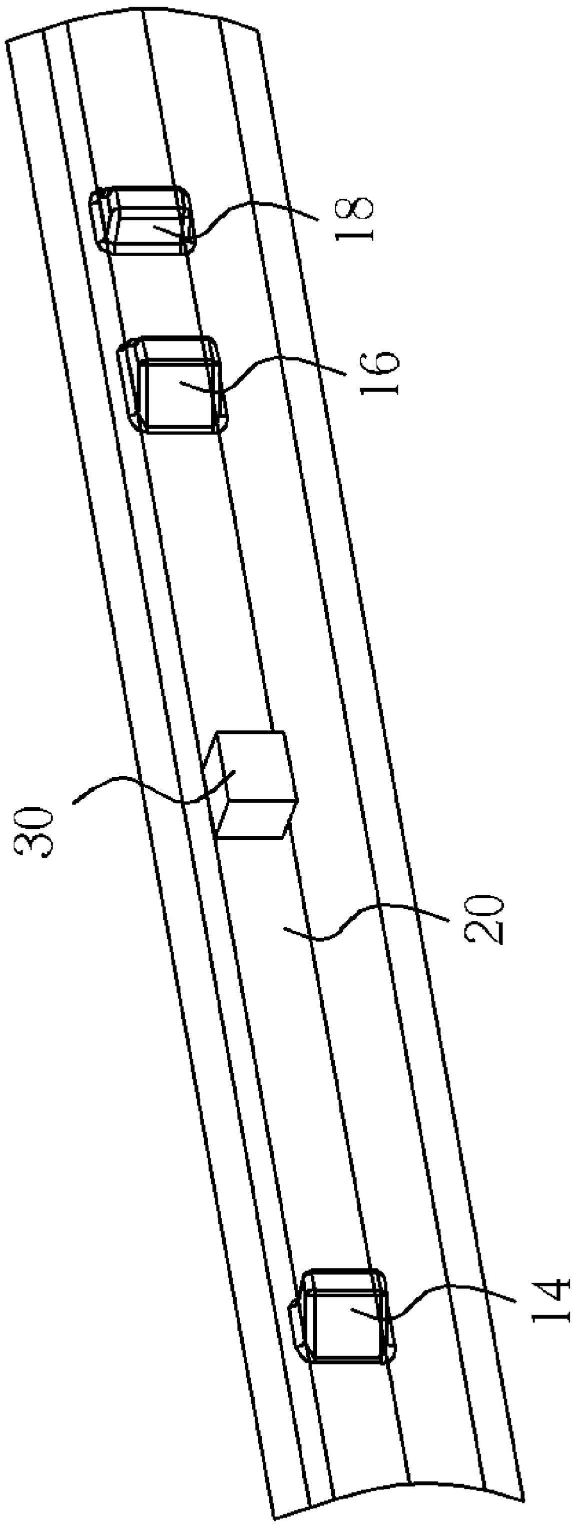
FIG. 5 is an illustration of the three stoppers on the right side of the satellite receiver of FIG. 1 and the block on the right inner side of the cover of FIG. 3.
Figure 6:
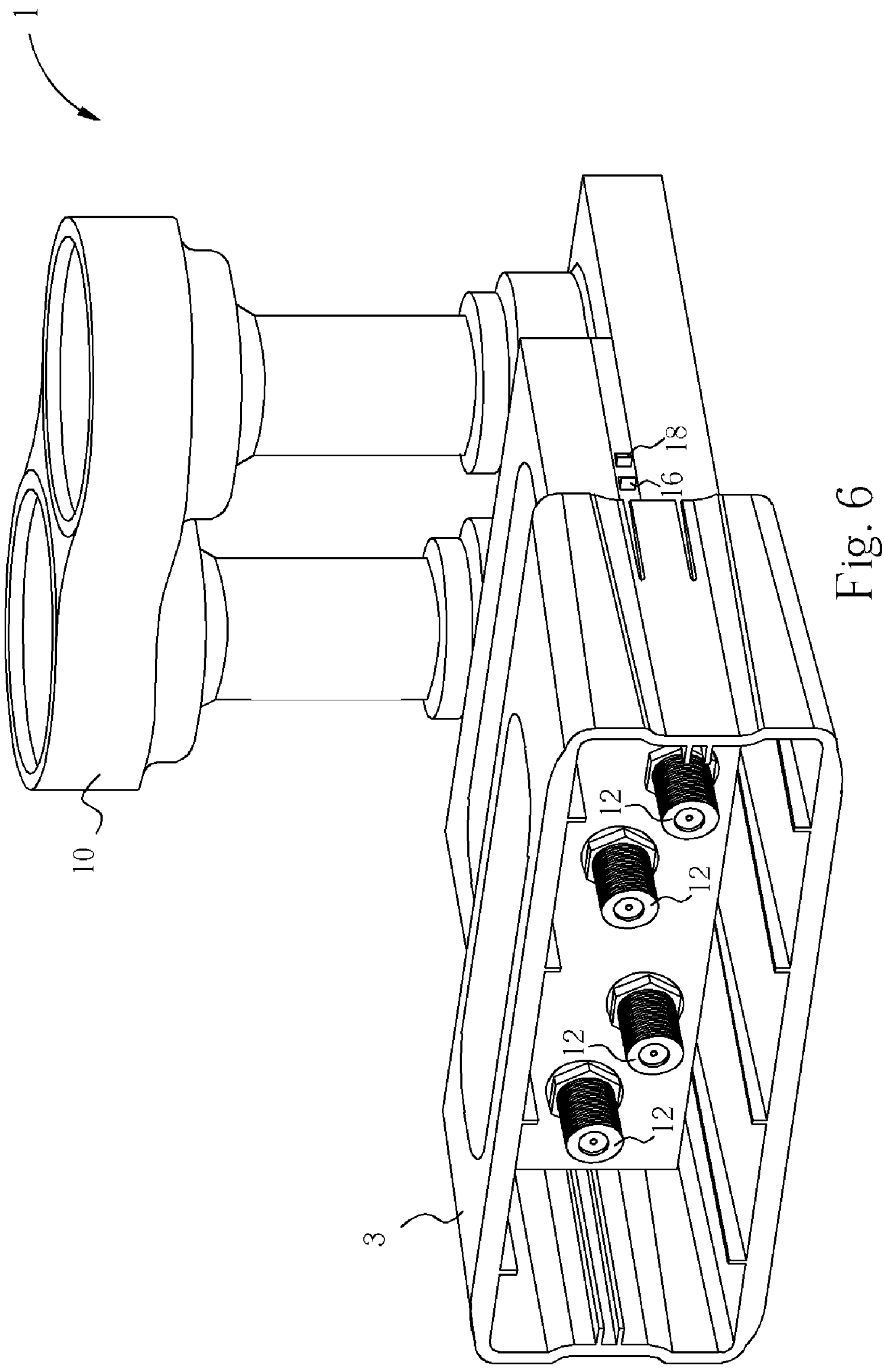
FIG. 6 and FIG. 7 are illustrations of coupling the cover of FIG. 3 with the satellite receiver of FIG. 1.

Please refer to FIG. 5, which is an illustration of the three stoppers 14, 16, 18 on the right side of the satellite receiver 1 of FIG. 1 and the block 30 on the right inner side of the cover 3 of FIG. 3. The block 30 of the cover 3 crosses the first stopper 14 to couple the cover 3 with the satellite receiver 1. As shown in FIG. 2, an angle formed between a first end of the first stopper 14 and a side of the main body 10 is an obtuse angle, and thereby the block 30 is capable of crossing the first stopper 14 from the first side of the first stopper 14, as shown in FIG. 6. An angle formed between a second end of the first stopper 14 and the side of the main body 10 is an acute or right angle so that the second side of the first stopper 14 is capable of preventing the block 30 from crossing the first stopper 14 from the second side of the first stopper 14, and the cover 3 is capable of protecting the signal transmission connectors 12. Angles between each side of the second stopper 16 and the side of the main body 10 are obtuse angles, such that the block 30 is capable of crossing the second stopper 16 from both sides of the second stopper 16.

Figure 7:
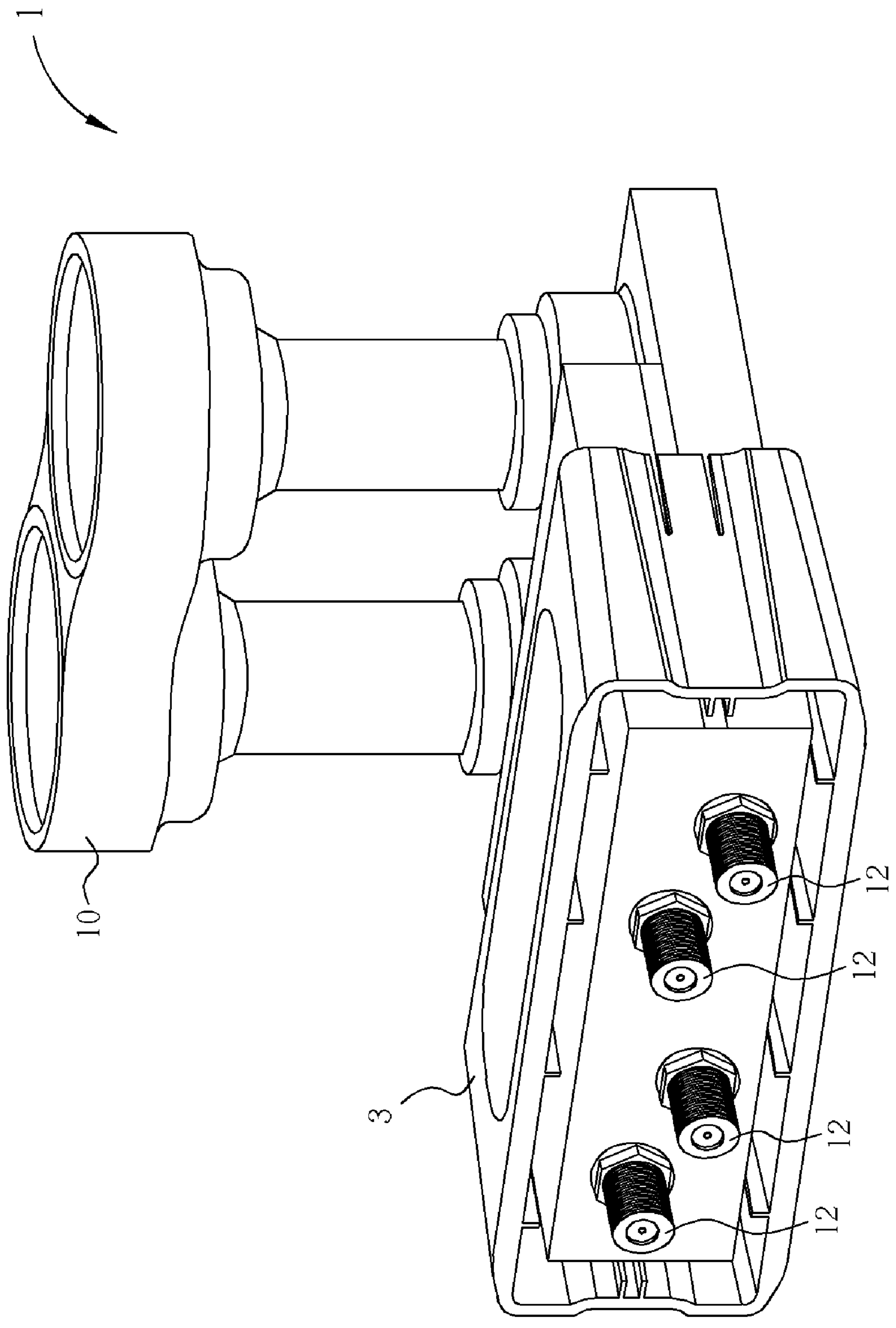

If the block 30 crosses the second stopper 16, the block 30 is finally located between the second stopper 16 and the third stopper 18, as shown in FIG. 7. An angle formed between a side of the third stopper 18 near the second stopper 16 and the side of the main body 10 is an acute or right angle, thereby preventing the block 30 from crossing the third stopper 18. In addition, since the cover is made of plastic, the plastic material around slots 34 can deflect a little to assist the block 30 in crossing the second stopper 16 or the first stopper 14.

Figure 8:
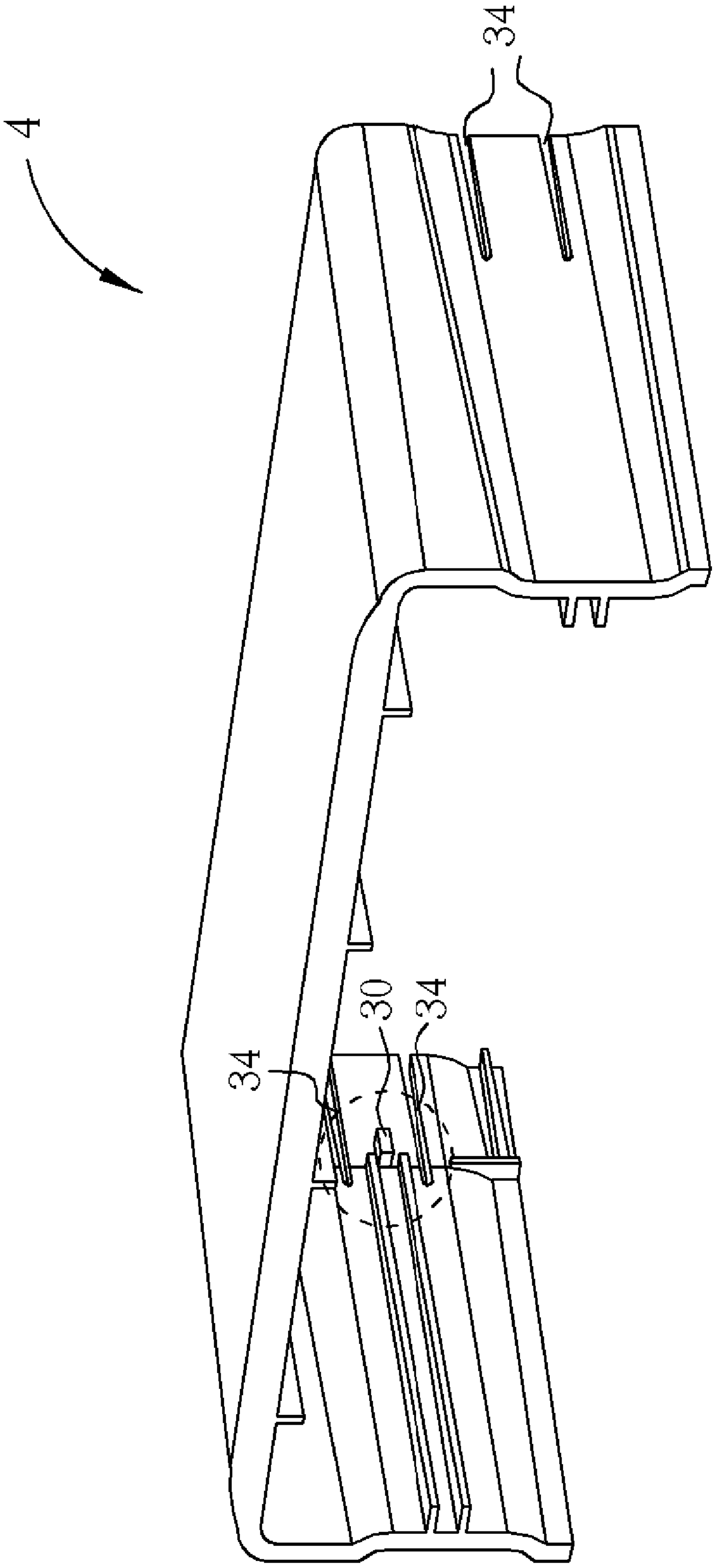
FIG. 8 is an illustration of another embodiment of the cover based on the present invention.

In order to make the cover 3 move along the main body 10 stably, the present invention adds a plurality of ribs 36 on the inner side of the cover 3 to reduce space between the cover 3 and the satellite receiver 1. When the cover 3 is pulled out, the cover 3 is capable of contacting the satellite receiver 1 closely. Additionally, the cover 3 of the present invention is a sleeve-shaped cover or a plate cover. The cover 3 of FIG. 3 is an embodiment of a sleeve-shaped cover, and a cover 4 of FIG. 8 is an embodiment of a plate cover. Since the satellite receiver 1 is positioned outside, the side on which the signal transmission connectors 12 are positioned faces down. Thus, the covers 3 and 4 can protect the signal transmission connectors 12 from rain.

The present invention provides a method of connecting elements of different materials, which reduces the cost of the plastic main body coupled with the aluminum alloy main body, and also achieves the purpose of keeping rain away from the signal transmission connectors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A satellite receiver comprising:

a main body having a first stopper and a second stopper; and a cover having a block disposed on an inner side of the cover, the block capable of sliding between the first stopper and the second stopper when the cover is coupled with the main body, wherein the main body further comprises a third stopper for restricting a motion of the block cover when the block of the cover crosses the second stopper and slides between the second stopper and the third stopper wherein the second stopper is positioned between the first stopper and the third stopper, wherein an angle formed between a side of the third stopper near the second stopper and a side of the main body is an acute angle of a right angle; and a plurality of signal transmission connectors positioned on a side of the main body for transmitting signals from the satellite receiver, wherein the cover protects the transmission connectors.

2. The satellite receiver of claim 1, wherein the main body further forms a track, and the first stopper and the second stopper are positioned on the track.

3. The satellite receiver of claim 1, wherein the first stopper has a first side and a second side, the distance between the second side of the first stopper and the second stopper is shorter than the distance between the first side of the first stopper and the second stopper, and an angle formed between the first side of the first stopper and a side of the main body is an obtuse angle, the block of the cover capable of crossing the first stopper from the first side of the first stopper.

4. The satellite receiver of claim 1, wherein the first stopper has a first side and a second side, the distance between the second side of the first stopper and the second stopper is shorter than the distance between the first side of the first stopper and the second stopper, and an angle formed between the second side of the first stopper and a side of the main body is an acute angle or a right angle for preventing the block of the cover from crossing the first stopper by the second side.

5. The satellite receiver of claim 1, wherein an angle formed between a first side of the second stopper and a side of the main body is an obtuse angle, and an angle between a second side of the second stopper and the side of the main body is an obtuse angle for allowing the block of the cover to cross the second stopper from the first side or the second side of the second stopper.

6. The satellite receiver of claim 1, wherein the cover further comprises a slot for assisting the block of the cover in crossing the first stopper or the second stopper, the block of the cover being positioned at an end of the slot.

7. The satellite receiver of claim 1, wherein the main body is made of aluminum alloy material.

8. The satellite receiver of claim 1, wherein the cover is made of plastic material.

9. The satellite receiver of claim 1, wherein the cover further comprises a plurality of ribs positioned on an inner side of the cover and contacting the main body.

10. The satellite receiver of claim 1, wherein the cover is selected from a group consisting of a plate cover and a sleeve-shaped cover.

* * * * *